United States Patent
Park et al.

(10) Patent No.: US 8,334,574 B2
(45) Date of Patent: Dec. 18, 2012

(54) SEMICONDUCTOR CONTACT STRUCTURE AND METHOD OF FABRICATING THE SAME

(75) Inventors: Joo-Sung Park, Seoul (KR); Se-Keun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 12/813,107

(22) Filed: Jun. 10, 2010

(65) Prior Publication Data

US 2011/0163394 A1     Jul. 7, 2011

(30) Foreign Application Priority Data

Jan. 6, 2010   (KR) .......................... 10-2010-0000998

(51) Int. Cl.
*H01L 29/04* (2006.01)

(52) U.S. Cl. ........ 257/377; 257/384; 257/576; 257/755; 257/757; 257/768; 257/770; 257/E21.199; 257/E21.203; 257/E21.296; 257/E21.593

(58) Field of Classification Search .......................... None
See application file for complete search history.

(56) References Cited

U.S. PATENT DOCUMENTS

| 4,829,024 A | 5/1989 | Klein et al. |
| 2001/0020715 A1* | 9/2001 | Yamasaki et al. ............. 257/310 |
| 2004/0173849 A1* | 9/2004 | Yamazaki et al. ............ 257/347 |
| 2006/0121660 A1* | 6/2006 | Rhee et al. .................... 438/197 |
| 2008/0290421 A1* | 11/2008 | Wang et al. ................... 257/384 |
| 2009/0081836 A1* | 3/2009 | Liu et al. ....................... 438/229 |

FOREIGN PATENT DOCUMENTS

| KR | 100604667 B1 | 7/2006 |
| KR | 1020080029298 A | 4/2008 |

* cited by examiner

*Primary Examiner* — Fei Fei Yeung Lopez
(74) *Attorney, Agent, or Firm* — Myers Bigel Sibley & Sajovec, P.A.

(57) ABSTRACT

Semiconductor fabricating technology is provided, and particularly, a method of fabricating a semiconductor device improving a contact characteristic between a silicon layer including carbon and a metal layer during a process of fabricating a semiconductor device is provided. A semiconductor device including the silicon layer including carbon and the metal layer formed on the silicon layer is provided. A metal silicide layer is interposed between the silicon layer including carbon and the metal layer.

16 Claims, 11 Drawing Sheets

SEMICONDUCTOR CONTACT STRUCTURE AND METHOD OF FABRICATING THE SAME

PRIORITY STATEMENT

This application claims the benefit of priority under 35 U.S.C. §119 from Korean Patent Application No. 10-2010-0000998, filed on Jan. 6, 2010, the contents of which are hereby incorporated herein by reference in its entirety.

BACKGROUND

1. Field

Example embodiments relate to semiconductor fabrication technology, and more particularly, to a process of fabricating a semiconductor device having a silicon layer in contact with a metal layer.

2. Description of Related Art

Due to smaller and highly-integrated semiconductor devices, contacts in DRAMs have decreased in size. The decrease in contact size can lead to a decrease in contact area, and thus can increase contact resistance. A product of the reaction occurring between an interfacial surface and a layer to be in contact therewith may show an abnormal characteristic value. Specifically, the contact between the silicon layer and the metal layer can cause an increase in contact resistance caused by heterojunction.

To address this issue, technology of forming a silicide layer having an interfacial property between the silicon layer and the metal layer can be used.

SUMMARY

An example embodiment is directed to a semiconductor device having a contact pad structure formed by sequentially stacking a contact hole partially exposing a silicon layer, a first silicon layer on an inner sidewall of the contact hole, and a second silicon layer including carbon. The example embodiment is also directed to a method of fabricating a semiconductor device including forming a contact hole partially exposing a silicon layer, and forming a contact pad by sequentially stacking a first silicon layer on an inner sidewall of the contact hole and a second silicon layer including carbon.

According to an example embodiment, a semiconductor device including a silicon layer including carbon and a metal layer formed on the silicon layer is provided. A silicide layer is interposed between the silicon layer including carbon and the metal layer.

In some embodiments, the metal layer may include a barrier layer. The barrier layer may be a titanium layer.

In another embodiment, the metal layer may include another conductive layer formed on the barrier layer.

According to another example embodiment, a semiconductor device having a first contact pad and a second contact pad including carbon formed on the first contact pad is provided. A silicide layer is disposed on the second contact pad. A metal layer is provided on the silicide layer.

In some embodiments, the metal layer may be a lower electrode of a capacitor.

In another embodiment, the metal layer may be a contact plug.

According to still another example embodiment, a semiconductor device having a polysilicon gate including carbon and a silicide layer formed on the polysilicon gate is provided. A metal gate is disposed on the silicide layer.

In some embodiments, the metal gate may be formed of tungsten.

In another embodiment, the polysilicon gate may include the carbon at a concentration of about 1.0 E20 to about 5.0 E20 atoms/cm$^3$.

According to yet another example embodiment, a semiconductor device having a first silicon pattern including carbon formed on a substrate is provided. A metal pattern is disposed on the first silicon pattern. A metal silicide layer is interposed between the first silicon pattern and the metal pattern.

In some embodiments, a second silicon pattern in contact with the first silicon pattern may be provided. The second silicon pattern may not include carbon. The second silicon pattern may cover a sidewall and a bottom of the first silicon pattern.

In another embodiment, the metal silicide layer may be in contact with the first and second silicon patterns.

In another embodiment, the first silicon pattern may include a polysilicon layer. The second silicon pattern may include a polysilicon layer.

In another embodiment, an interlayer insulating layer formed on the substrate may be provided. The first and second silicon patterns may be formed in a contact hole passing through the interlayer insulating layer.

In another embodiment, the metal pattern may include one selected from the group consisting of TI, TiN, Ta, TaN, W, WN, Co, Cu, Ni, and Mo.

In another embodiment, the metal silicide layer may include one selected from the group consisting of TiSiC, TiSiCN, TaSiC, TaSiCN, WSiC, WSiCN, CoSiC, CuSiC, NiSiC, and MoSiC.

In another embodiment, the first silicon pattern may include carbon at a concentration of about 1.0 E20 to about 5.0 E20 atoms/cm$^3$.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
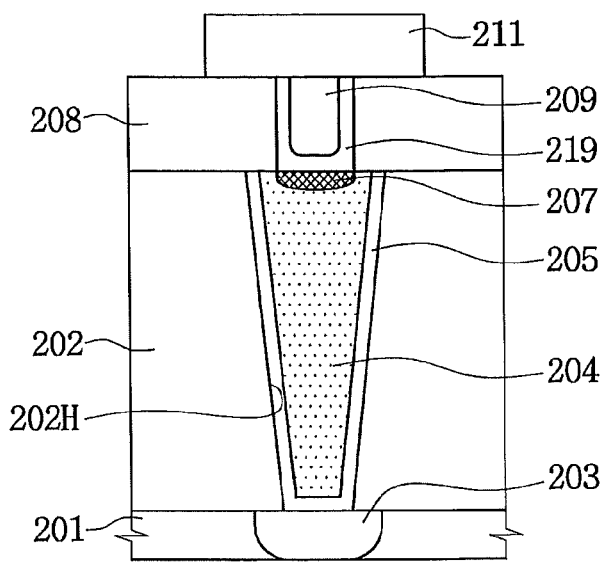
FIGS. 1 through 3 are cross-sectional views of semiconductor devices according to first to third example embodiments, respectively.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

[First Example Embodiment]

FIG. 1 is a cross-sectional view of a semiconductor device according to a first example embodiment.

Referring to FIG. 1, to fabricate a semiconductor device according to the example embodiment, first, an impurity region 203 is formed on an active region of a semiconductor substrate 201 using an ion implantation or diffusion process. An insulating layer 202 is formed on the semiconductor substrate 201 having the impurity region 203.

Subsequently, contact pads 204 and 205 are formed in a contact hole 202H formed in the insulating layer 202. The contact pads 204 and 205 may be formed in a multi-layer structure, and in the embodiment, are formed in a contact pad structure having a double layer. To form the contact pads 204 and 205, a first contact pad layer 205 is formed on a sidewall and a lower region of the contact hole 202H. Here, the first contact pad layer 205 may be formed of polysilicon. Subsequently, a second contact pad layer 204 is formed on the resultant structure having the first contact pad layer 205. The second contact pad layer 204 may be formed of polysilicon including carbon. Subsequently, the resultant structure having the first and second contact pad layers 205 and 204 is planarized through polishing, thereby forming the contact pads 204 and 205 in a double layer structure.

Subsequently, an interlayer insulating layer 208 is formed on the contact pads 204 and 205, and is filled with a metal layer. Metal plugs 209 and 219 are formed through polishing, which is also used to form the contact pads 204 and 205. The contact pads 204 and 205 are formed of polysilicon, and the metal plugs 209 and 219 are formed of metal, so that they form a heterojunction. However, a silicide layer 207 produced by subsequent annealing reduces a contact resistance between the contact pads and the metal plugs. The contact pads 204 and 205 formed in a double layer structure can form a more uniform silicide layer than a single-layered contact pad because the polysilicon layer including carbon has a smaller grain than polysilicon that does not contain carbon. In some embodiments according to the inventive concept, the silicide layer provides an ohmic contact.

As appreciated by the present inventors, when a grain in polysilicon is large, the silicide layer to be formed may be further agglomerated, thereby allowing formation of a nonuniform silicide layer. Accordingly, and as further appreciated by the present inventors, when the grain is small, a grain of the silicide layer, which is the resultant structure produced by reaction with metal, also becomes smaller. The decreased grain can reduce a resistance and also reduce a leakage current.

The metal plugs 209 and 219 may be formed by sequentially stacking conductive layers such as a barrier layer 219 and a metal layer 209. A bit line 211 may be formed on the interlayer insulating layer 208. The bit line 211 may be in contact with the metal plugs 209 and 219. The bit line 211 may be in electrical contact with the impurity region 203 via the metal plugs 209 and 219, the silicide layer 207, and the contact pads 204 and 205.

It will be understood that, as used herein, the term "ohmic contact" refers to contacts where an impedance associated therewith is substantially given by the relationship of Impedance =V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about 10 e−03 ohm-cm$^2$ and, in some embodiments less than about 10 e−04 ohm-cm$^2$. Thus, a contact that is rectifying or that has a high specific contact resistivity, for example, a specific contact resistivity of greater than about 10 e−03 ohm-cm$^2$, is not an ohmic contact as that term is used herein.

As used herein, a silicide includes mixtures including a metal and silicon and/or polysilicon with carbon fused together or dissolving into each other when the silicide is formed by, for example, annealing. It will be understood, for example, that a silicide of TiSiC can be a mixture (or alloy) of Titanium and Silicon including Carbon when annealed. The silicide can also be formed through an ablation process.

Figure 4:
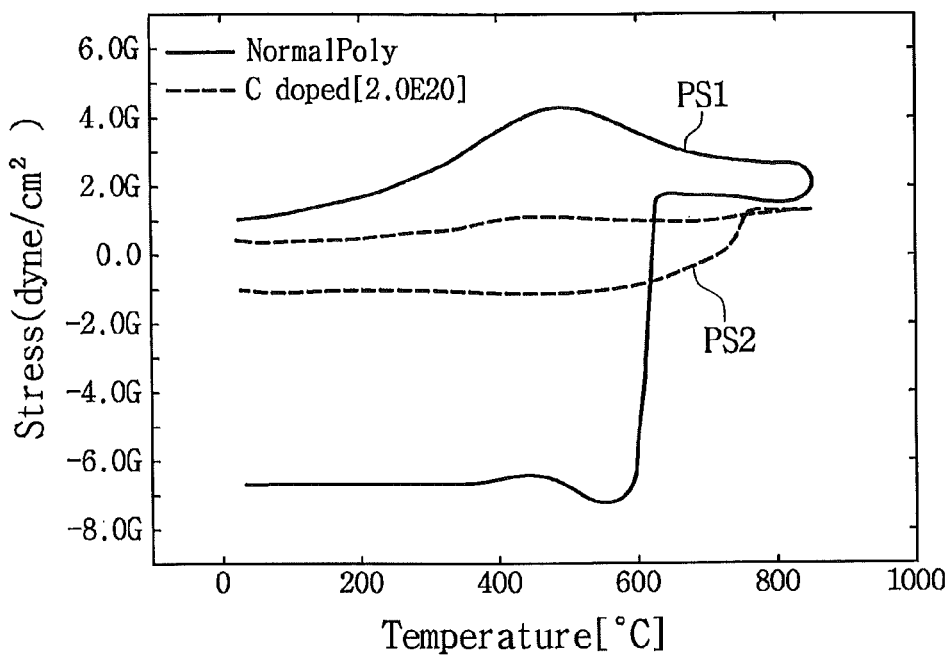
FIG. 4 is a graph showing stress hysteresis according to temperature.

FIG. 4 is a graph showing stress values of general polysilicon and polysilicon including carbon according to temperature. In the case of the general polysilicon shown in the curve PS1, the stress value is drastically increased at about 600° C., but in the case of the polysilicon including carbon shown in the curve PS2, the stress value is stable without a significant change in an entire range of temperature. The stress value of the polysilicon including carbon is close to 0 at about 500° C., but the stress value of the general polysilicon is close to 4 G (dyne/cm$^2$). The polysilicon including carbon is less influenced by a stress change according to the temperature change, so that it can obtain a good characteristic when being applied to a product.

Figure 5:
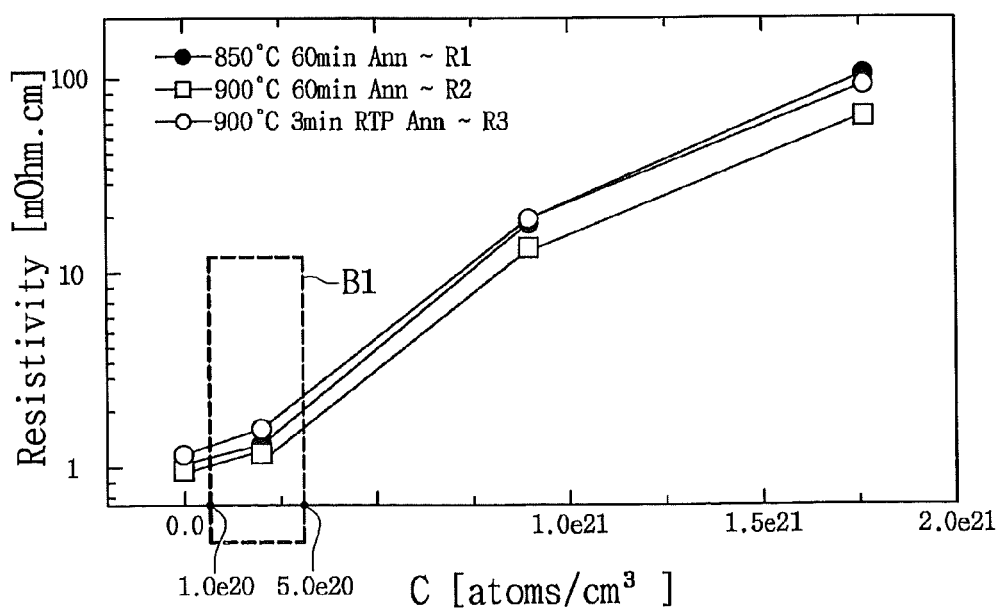
FIG. 5 is a graph showing a change in resistance according to the content of carbon included in polysilicon.

FIG. 5 is a graph showing a resistance value of polysilicon according to the content of carbon included in the polysilicon. The graph shows a desirable result when the content of carbon is in a range of the block B1. The content of carbon exhibiting a desirable effect may be in the range from about 1.0 E20 to about 5.0 E20 atoms/cm$^3$, which corresponds to the range of the block B1 of FIG. 5. In some embodiments, the second contact pad layer 204 may be a polysilicon layer including carbon having a concentration of about 1.0 E20 to about 5.0 E20 atoms/cm$^3$. As the higher content of carbon is contained, the resistance value of polysilicon is substantially increased. However, in the blocked range, such an effect cannot be shown, so that a small increase in resistance value is insignificant. In FIG. 5, the curves R1, R2, and R3 show the changes in resistance according to annealing.

[Second Example Embodiment]

Figure 2:
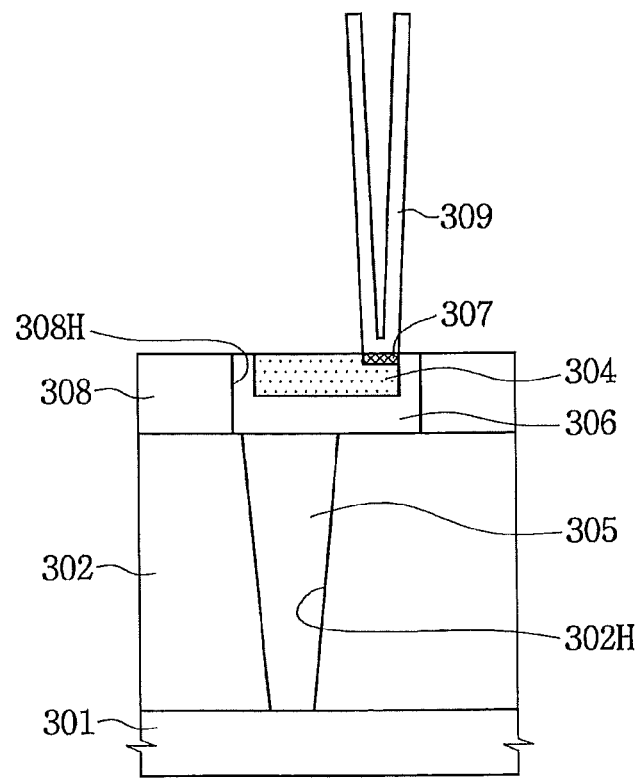

FIG. 2 is a cross-sectional view of a semiconductor device according to a second example embodiment.

Referring to FIG. 2, to fabricate a semiconductor device according to the second example embodiment, an insulating layer 302 is formed on a semiconductor substrate 301, and a contact hole 302H is formed to form a contact pad allowing a capacitor of a DRAM cell to be in contact with a source region of a transistor. Subsequently, a polysilicon material may be formed in the contact hole 302H and polished, thereby forming a contact pad 305.

Here, when it is difficult to perform contact alignment by reducing an upper area of the contact pad 305, an additional pad for a contact margin is formed. Such a pad is referred to as landing pads 304 and 306. Particularly, an interlayer insulating layer 308 may be formed on the contact pad 305. An opening 308H passing through the contact pad 305 may be formed through the interlayer insulating layer 308. The first and second pads 306 and 304 may be formed in the opening 308H. The first pad 306 may be formed of a polysilicon layer. The second pad 304 may be formed of a polysilicon layer including carbon. The first and second pads 306 and 304 may constitute the landing pads 304 and 306. In some embodiments, the first pad 306 may be omitted. A lower electrode 309 of a capacitor may be formed on the landing pads 304 and 306. The lower electrode 309 may be a one cylinder storage (OCS). The lower electrode 309 may be formed of a metal layer. Subsequently, a metal silicide layer 307 may be formed between the lower electrode 309 and the second pad 304 using annealing.

In the second example embodiment, the lower electrode 309 of the capacitor is also formed of metal, so that the polysilicon is also in contact with metal as described above. Since the contact structure causes the same contact problem as in the first example embodiment, the second example embodiment is also provided to solve the same problem. Thus, the regions of the landing pads 304 and 306 in contact with the lower metal electrode of the DRAM capacitor may need to be formed of polysilicon including carbon. As a result, since the second pad 304 including carbon and the first pad 306 that does not contain carbon have a landing pad structure integrated into a double layer structure, this structure is in contact with the lower electrode of the DRAM capacitor, and the silicide layer 307 formed in this contact structure may solve the resistance and leakage current problems.

[Third Example Embodiment]

Figure 3:
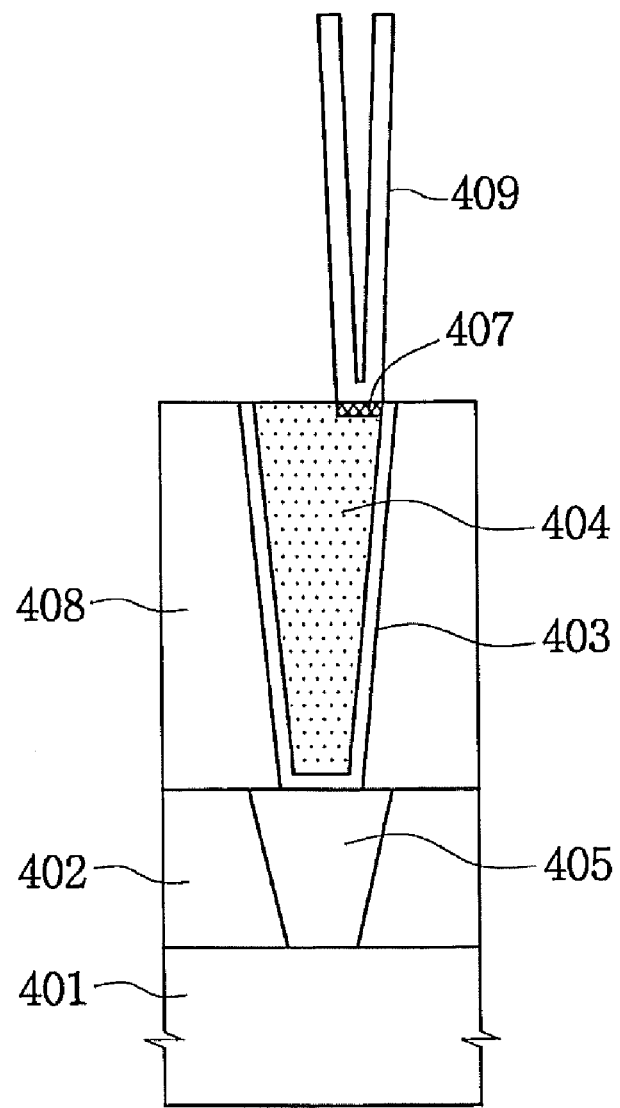

FIG. 3 is a cross-sectional view of a semiconductor device according to a third example embodiment.

Referring to FIG. 3, the semiconductor device according to the third example embodiment includes a semiconductor substrate 401, an insulating layer 402, a lower contact pad 405, an interlayer insulating layer 408, a first contact pad 403, a second contact pad 404, a metal silicide layer 407, and a lower electrode 409 of a capacitor.

The lower contact pad 405 in contact with the semiconductor substrate 401 may be formed using self-alignment, and contact pads 403 and 404 having a double layer structure are formed thereon. As described in FIG. 1, the first contact pad 403 formed of a general polysilicon film is formed on an inner sidewall of a contact hole, and the second contact pad 404 is formed of polysilicon including carbon. Thus, according to this embodiment, the DRAM lower electrode also has a junction structure of polysilicon including carbon and a metal component, so that resistance and leakage current characteristics are improved.

[Fourth Example Embodiment]

FIGS. 6 through 11 are cross-sectional views of a semiconductor device and a method of fabricating the same according to a fourth example embodiment.

Figure 6:
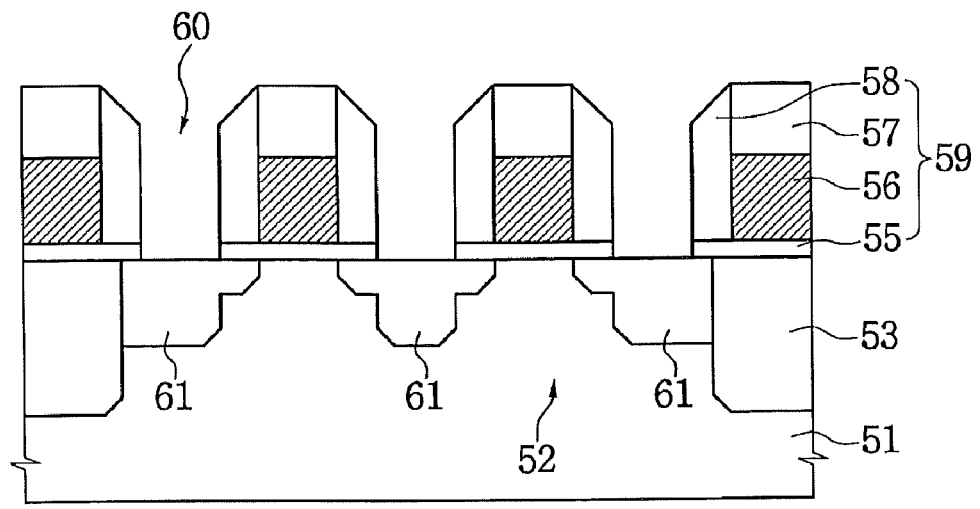
FIGS. 6 through 11 are cross-sectional views of a semiconductor device and a method of fabricating the same according to a fourth example embodiment.

Referring to FIG. 6, the semiconductor device according to the fourth example embodiment may include an isolation layer 53, gate patterns 59, and source and drain regions 61 on a substrate 51. Each gate pattern 59 may be composed of a gate dielectric layer 55, a gate electrode 56, a capping pattern 57, and a spacer 58.

The substrate 51 may be a semiconductor substrate such as a silicon wafer. The isolation layer 53 may be formed by shallow trench isolation (STI). The isolation layer 53 may be formed of an insulating layer such as a silicon oxide layer, a silicon nitride layer, a silicon oxynitride layer, and a combination thereof. An active region 52 may be defined on the substrate 51 by the isolation layer 53. The gate dielectric layer 55 may be formed of an insulating layer such as a silicon oxide layer, a silicon nitride layer, a silicon oxynitride layer, a high-k dielectric layer, and a combination thereof. The gate electrode 56 may be formed of a conductive layer such as a polysilicon layer, a metal silicide layer, a metal layer, and a combination thereof. The capping pattern 57 may be formed of an insulating layer such as a silicon oxide layer, a silicon nitride layer, a silicon oxynitride layer, and a combination thereof. The capping pattern 57 may cover an upper surface of the gate electrode 56. The spacer 58 may cover sidewalls of the capping pattern 57 and the gate electrode 56. The spacer 58 may be formed of an insulating layer such as a silicon oxide layer, a silicon nitride layer, a silicon oxynitride layer, and a combination thereof. The capping pattern 57 may be omitted.

The gate patterns 59 may cross over the active region 52 and the isolation layer 53. The source and drain regions 61 may be formed by injecting impurity ions into the active region 52 adjacent to both sides of the gate patterns 59. Openings may be provided in both sides of the gate patterns 59. The source and drain regions 61 may be exposed through a bottom of the openings 60.

Figure 7:
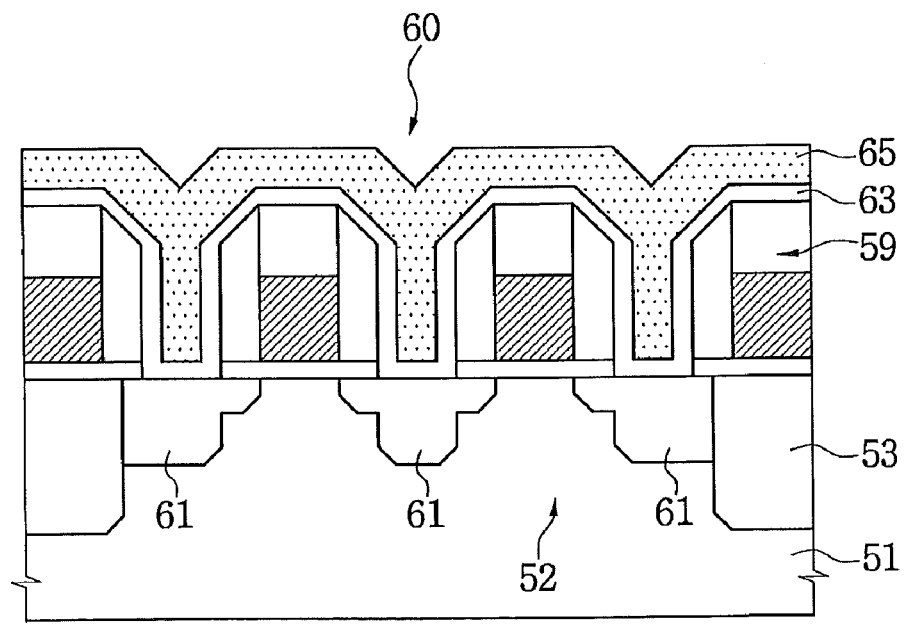

Referring to FIG. 7, a lower silicon layer 63 and an upper silicon layer 65 may be sequentially formed on the substrate 51. The lower silicon layer 63 may be formed of a polysilicon layer. The upper silicon layer 65 may be formed of a polysilicon layer including carbon. The upper silicon layer 65 may be a polysiliocn layer including carbon at a concentration of about 1.0 E20 to about 5.0 E20 atoms/cm$^3$.

Here, the lower silicon layer 63 may be a polysilicon layer including other impurity ions excluding carbon. For example, the lower silicon layer 63 may be a polysilicon layer including phosphorus. The lower silicon layer 63 may be in contact with the source and drain regions 61. The upper silicon layer 65 may cover the lower silicon layer 63. The lower and upper silicon layers 63 and 65 may completely fill the openings 60 and cover the gate patterns 59.

Figure 8:
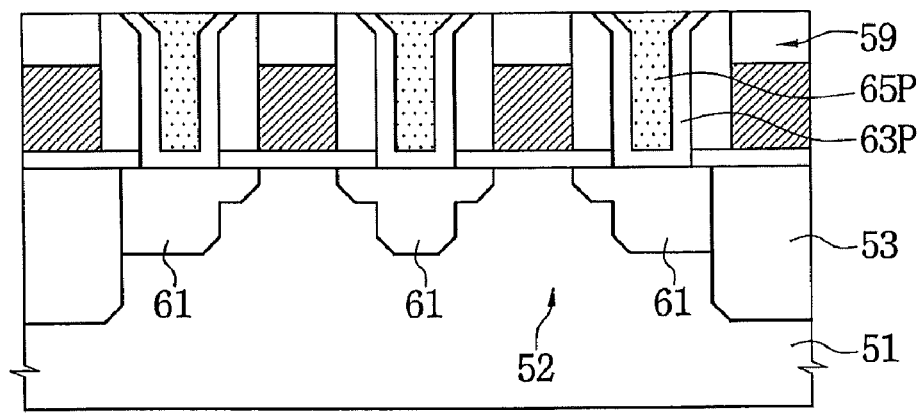

Referring to FIG. 8, a lower silicon pattern 63P and an upper silicon pattern 65P may be formed by processing the lower and upper silicon layers 63 and 65. The lower and upper silicon patterns 63P and 65P may be formed using one selected from the group consisting of chemical mechanical polishing (CMP), etch-back, patterning, and a combination thereof. As a result, upper surfaces of the gate patterns 59, the lower silicon pattern 63P and the upper silicon pattern 65P may be exposed on substantially the same plane. The lower silicon pattern 63P may cover a sidewall and a bottom of the upper silicon pattern 65P. The lower and upper silicon patterns 63P and 65P may be self-aligned between the gate patterns 59. In other words, the lower and upper silicon patterns 63P and 65P may constitute a self-align contact (SAC). A plurality of lower and upper silicon patterns 63P and 65P may be formed on the substrate 51.

Figure 9:
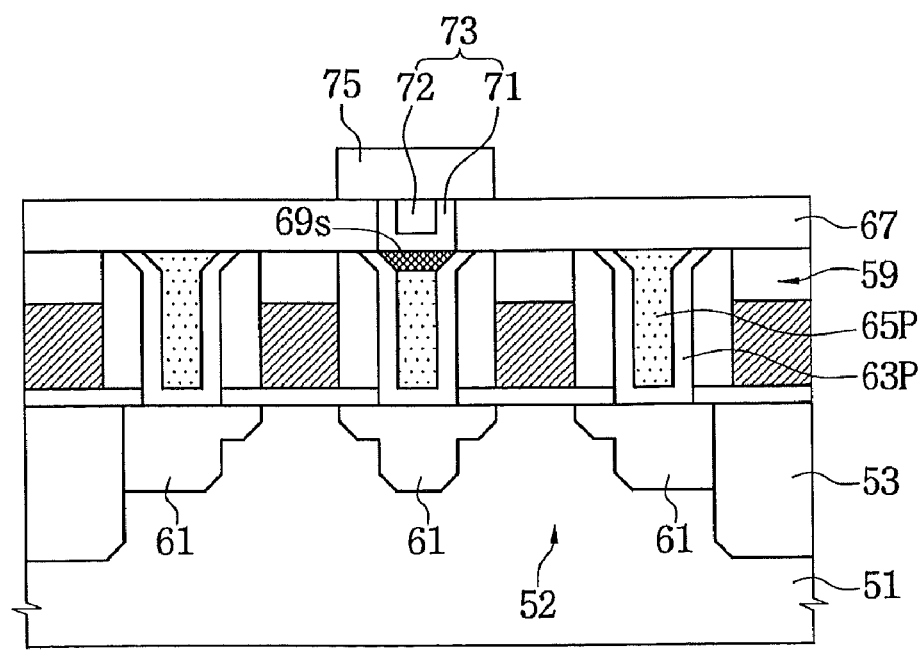

Referring to FIG. 9, a lower insulating layer 67 covering the lower and upper silicon patterns 63P and 65P may be formed. A bit plug 73 passing through the lower insulating layer 67 may be formed. The bit plug 73 may be formed by sequentially stacking a barrier layer 71 and a first metal pattern 72.

The barrier layer 71 may be formed of one selected from the group consisting of Ti, TiN, Ta, TaN, and a combination thereof. For example, the barrier layer 71 may be formed of a Ti layer or a Ti/TiN layer, The first metal pattern 72 may be formed of one selected from the group consisting of Ti, TiN, Ta, TaN, W, WN, Co, Cu, Ni, Mo and a combination thereof. The barrier layer 71 may cover a sidewall and a bottom of the first metal pattern 72. The bit plug 73 may be formed to fill a bit contact hole passing through the lower insulating layer 67.

The barrier layer 71 may be in contact with the upper silicon pattern 65P. Subsequently, a first metal silicide layer 69S may be formed by annealing the barrier layer 71 and the upper silicon pattern 65P. The first metal silicide layer 69S may be formed between the barrier layer 71 and the upper silicon pattern 65P. The first metal silicide layer 69S may be in contact with the upper silicon pattern 65P and the lower silicon pattern 63P. The first metal silicide layer 69S may include one selected from the group consisting of TiSiC, TiSiCN, TaSiC, TaSiCN, WSiC, WSiCN, CoSiC, CuSiC, NiSiC, and MoSiC.

A bit line 75 in contact with the bit plug 73 may be formed on the lower insulating layer 67. The bit line 75 may be formed of one selected from the group consisting of Ti, TiN, Ta, TaN, W, WN, Co, Cu, Ni, Mo and a combination thereof. The bit line 75 may be in electrical contact with one of the source and drain regions 61 via the bit plug 73, the first metal silicide layer 69S, the upper silicon pattern 65P and the lower silicon pattern 63P.

Figure 10:
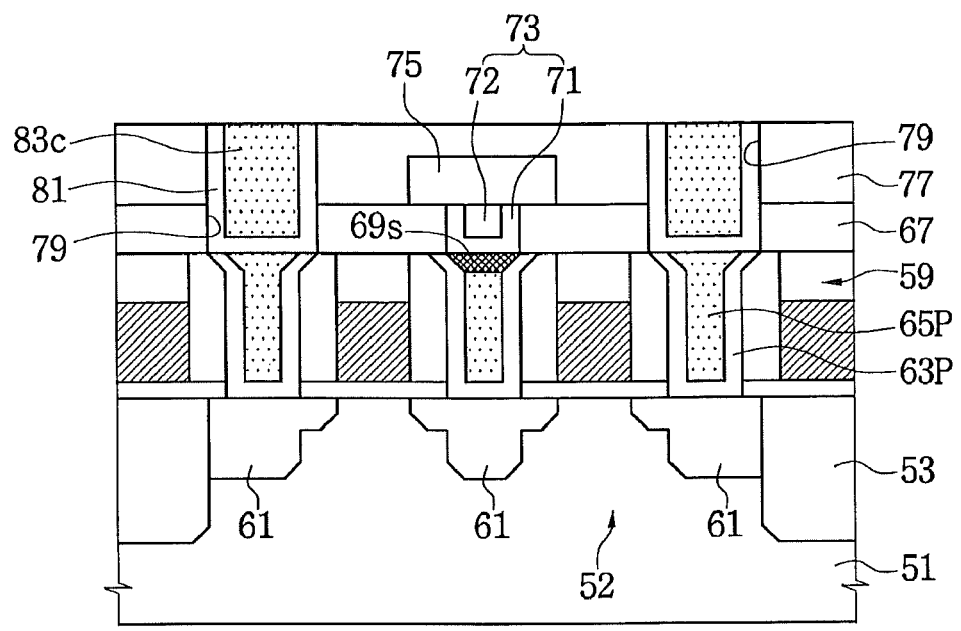

Referring to FIG. 10, an upper insulating layer 77 covering the bit line 75 may be formed on the lower insulating layer 67. A buried contact hole 79 passing through the upper insulating layer 77 and the lower insulating layer 67 may be formed. A first silicon pattern 81 and a second silicon pattern 83C may be sequentially stacked in the buried contact hole 79. The first and second silicon patterns 81 and 83C may be formed using one selected from the group consisting of CMP, etch-back, and a combination thereof. Upper surfaces of the upper insulating layer 77, the first silicon pattern 81, and the second silicon pattern 83C may be exposed on substantially the same plane. The first silicon pattern 81 may cover a sidewall and a bottom of the second silicon pattern 83C. The first and second silicon patterns 81 and 83C may constitute a buried contact plug.

The first silicon pattern 81 may be formed of a polysilicon layer. The second silicon pattern 83C may be formed of a polysilicon layer including carbon at a concentration of about 1.0 E20 to about 5 E20 atoms/cm$^3$. Here, the first silicon pattern 81 may be formed of a polysilicon layer including other impurity ions excluding carbon. For example, the first silicon pattern 81 may be formed of a polysilicon layer including phosphorous. The first silicon pattern 81 may be in contact with the upper silicon pattern 65P and/or the lower silicon pattern 63P.

Figure 11:
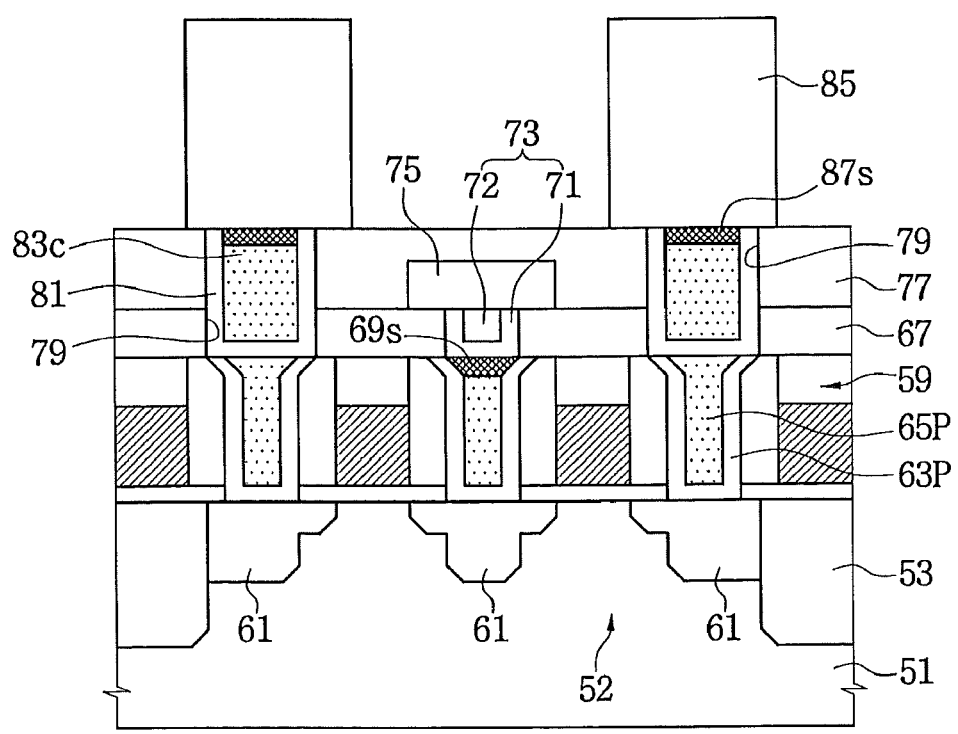

Referring to FIG. 11, a lower capacitor electrode 85 covering the second silicon pattern 83C may be formed on the upper silicon layer 77. The lower capacitor electrode 85 may be formed of one selected from the group consisting of Ti, TiN, Ta, TaN, W, WN, Co, Cu, Ni, Mo, and a combination thereof A second metal silicide layer 87S may be formed by annealing the lower capacitor electrode 85 and the second silicon pattern 83C. The second metal silicide layer 87S may include one selected from the group consisting of TiSiC, TiSiCn, TaSiC, TaSiCN, WSiC, WSiCN, CoSiC, CuSiC, NiSiC, and MoSiC. In some embodiments, the lower capacitor electrode 85 may be formed of a Ti/TiN layer. Here, the second metal silicide layer 87S may be a TiSiC layer.

The second metal silicide layer 87S may be interposed between the lower capacitor electrode 85 and the second silicon pattern 83C. The second metal silicide layer 87S may be in contact with the lower capacitor electrode 85, the first silicon pattern 81, and the second silicon pattern 83C. The lower capacitor electrode 85 may be in electrical contact with one of the source and drain regions 61 via the second metal silicide layer 87S, the second silicon pattern 83C, the first silicon pattern 81, the upper silicon pattern 65P, and the lower silicon pattern 63P.

[Fifth Example Embodiment]

FIGS. 12 through 16 are cross-sectional views of a semiconductor device and a method of fabricating the same according to a fifth example embodiment.

Figure 12:
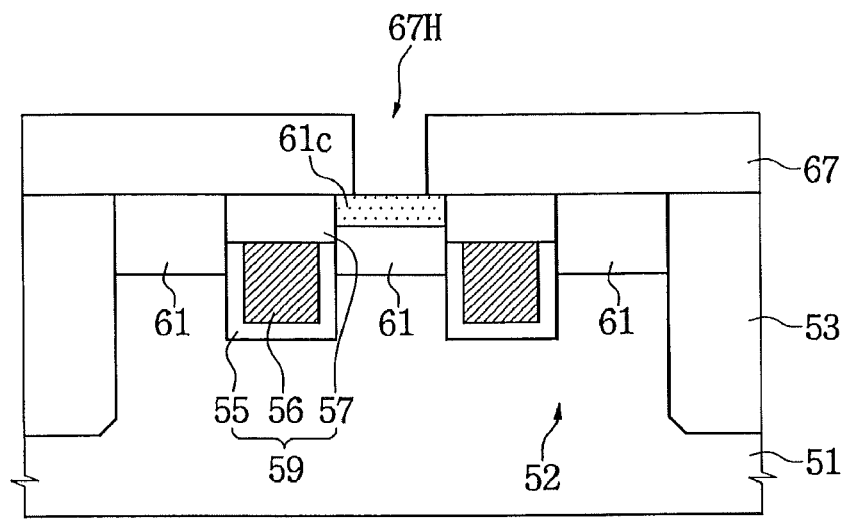
FIGS. 12 through 16 are cross-sectional views of a semiconductor device and a method of fabricating the same according to a fifth example embodiment.

Referring to FIG. 12, the semiconductor device according to the fifth example embodiment may include an isolation layer 53, gate patterns 59, and source and drain regions 61 on a substrate 51. Each gate pattern 59 may be composed of a gate dielectric layer 55, a gate electrode 56, and a capping pattern 57. The gate electrode 56 may be formed on a lower level than an upper surface of the substrate 51. An active region 52 may be defined on the substrate 51 by the isolation layer 53. The capping pattern 57 may cover an upper surface of the gate electrode 56. Upper surfaces of the source and drain regions 61 may be exposed.

A lower insulating layer 67 covering the gate patterns 59 and the source and drain regions 61 may be formed. A bit contact hole 67H exposing one of the source and drain regions 61 may be formed by patterning the lower insulating layer 67. A first silicon pattern 61C may be formed by injecting carbon into one of the source and drain regions 61 using the lower insulating layer 67 as an ion implantation mask. The first silicon pattern 61C may be formed to include carbon at a concentration of about 1.0 E20 to about 5.0 E20 atoms/cm³.

Figure 13:
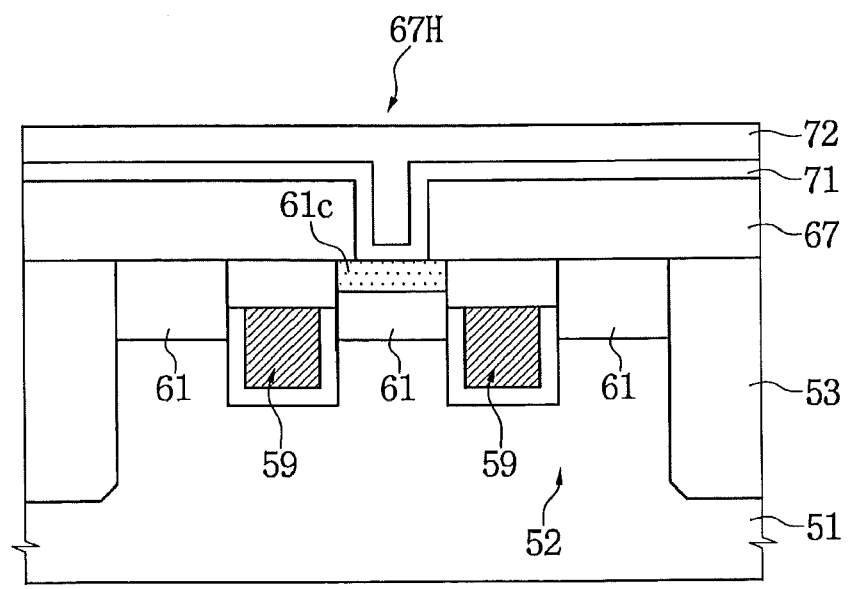

Referring to FIG. 13, a barrier layer 71 and a first metal layer 72 may be sequentially formed on the substrate 51 having the first silicon pattern 61C. The barrier layer 71 may be in contact with the first silicon pattern 61C, and cover a sidewall of the bit contact hole 67H and the lower insulating layer 67. The first metal layer 72 may completely fill the bit contact hole 67H, and cover the barrier layer 71. The barrier layer 71 may be formed of a metal layer such as one selected from the group consisting of Ti, TiN, Ta, TaN, and a combination thereof. For example, the barrier layer 71 may be formed of a Ti layer or a Ti/TiN layer. The first metal layer 72 may be formed of a metal layer such as one selected from the group consisting of Ti, TiN, Ta, TaN, W, WN, Co, Cu, Ni, Mo, and a combination thereof.

Figure 14:
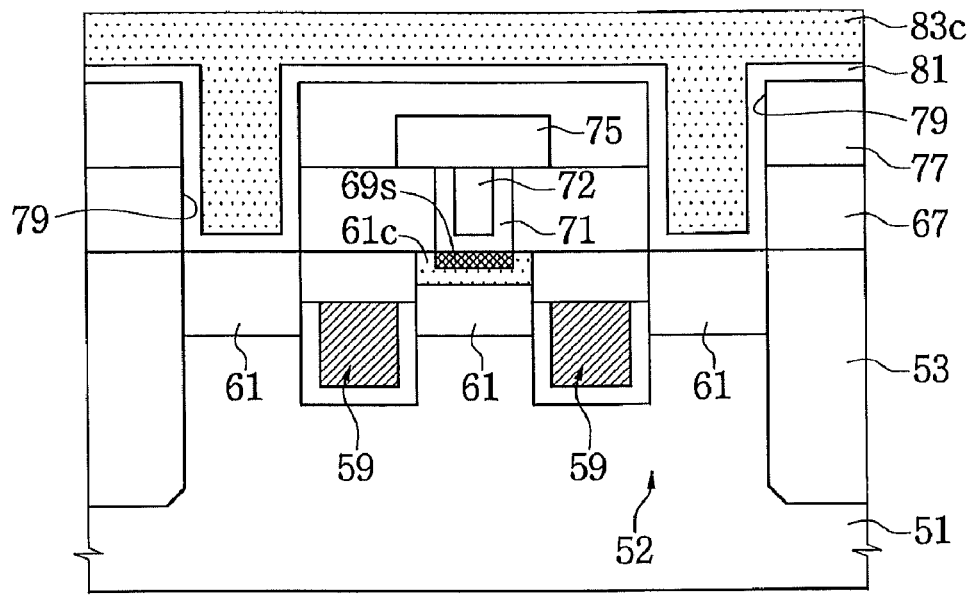

Referring to FIG. 14, a first metal silicide layer 69S may be formed by annealing the barrier layer 71 and the first silicon pattern 61C. The first metal silicide layer 69S may be formed between the barrier layer 71 and the first silicon pattern 61C. The first metal silicide layer 69S may be in contact with the first silicon pattern 61C and the barrier layer 71. The first metal silicide layer 69S may include one selected from the group consisting of TiSiC, TiSiCN, TaSiC, TaSiCN, WSiC, WSiCN, CoSiC, CuSiC, NiSiC, and MoSiC.

The first metal layer 72 and the barrier layer 71 may be partially removed to expose the lower insulating layer 67 using one selected from the group consisting of CMP, etch-back, and a combination thereof. As a result, the barrier layer 71 and the first metal layer 72 may be maintained in the bit contact hole 67H. The barrier layer 71 and the first metal layer 72 may constitute bit plugs 71 and 72.

A bit line 75 in contact with the bit plugs 71 and 72 may be formed on the lower insulating layer 67. The bit line 75 may be formed of one selected from the group consisting of Ti, TiN, Ta, TaN, W, WN, Co, Cu, Ni, Mo, and a combination thereof. The bit line 75 may be in electrical contact with one of the source and drain regions 61 via the first metal layer 72, the barrier layer 71, the first metal silicide layer 69S, and the first silicon pattern 61C.

An upper insulating layer 77 covering the bit line 75 may be formed on the lower insulating layer 67. A buried contact hole 79 may be formed through the upper insulating layer 77 and the lower insulating layer 67. A second silicon layer 81 and a third silicon layer 83C may be sequentially formed in the buried contact hole 79. The second silicon layer 81 may be formed of a polysilicon layer. The third silicon layer 83C may be formed of a polysilicon layer including carbon at a concentration of about 1.0 E20 to about 5.0 E20 atoms/cm³. Here, the second silicon layer 81 may be a polysilicon layer including other impurity ions excluding carbon. For example, the second silicon layer 81 may be a polysilicon layer including phosphorous.

Figure 15:
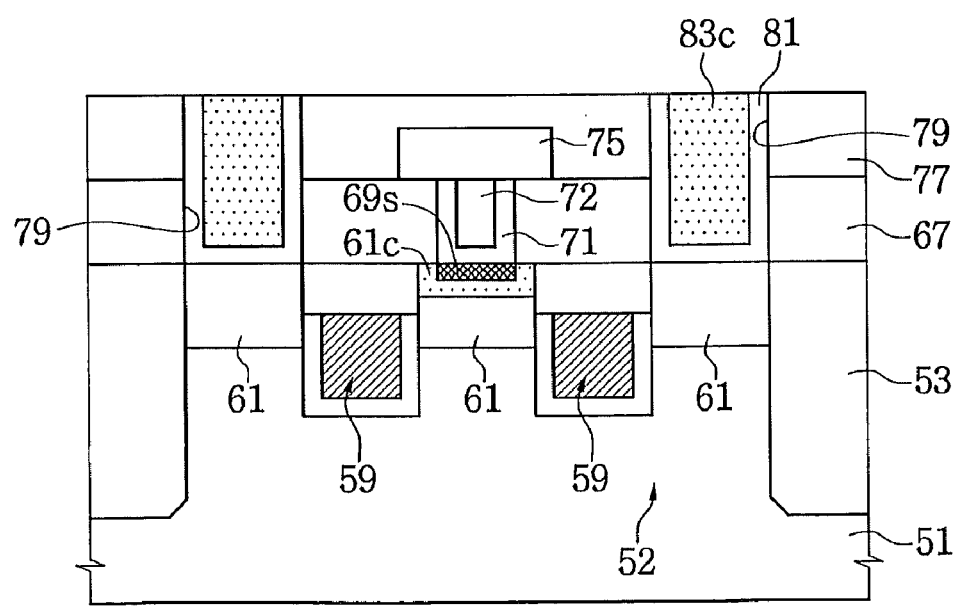

Referring to FIG. 15, the second and third silicon layers 81 and 83C may be partially removed to expose the upper silicon layer 77 using one selected from CMP, etch-back, and a combination thereof. As a result, the second and third silicon layers 81 and 83C may be maintained in the buried contact hole 79. The second and third silicon layers 81 and 83C may constitute a buried contact plug.

Upper surfaces of the upper insulating layer 77, the second silicon layer 81, and the third silicon layer 83C may be exposed on substantially the same plane. The second silicon layer 81 may cover a sidewall and a bottom of the third silicon layer 83C. The second silicon layer 81 may be in contact with one of the source and drain regions 61.

Figure 16:
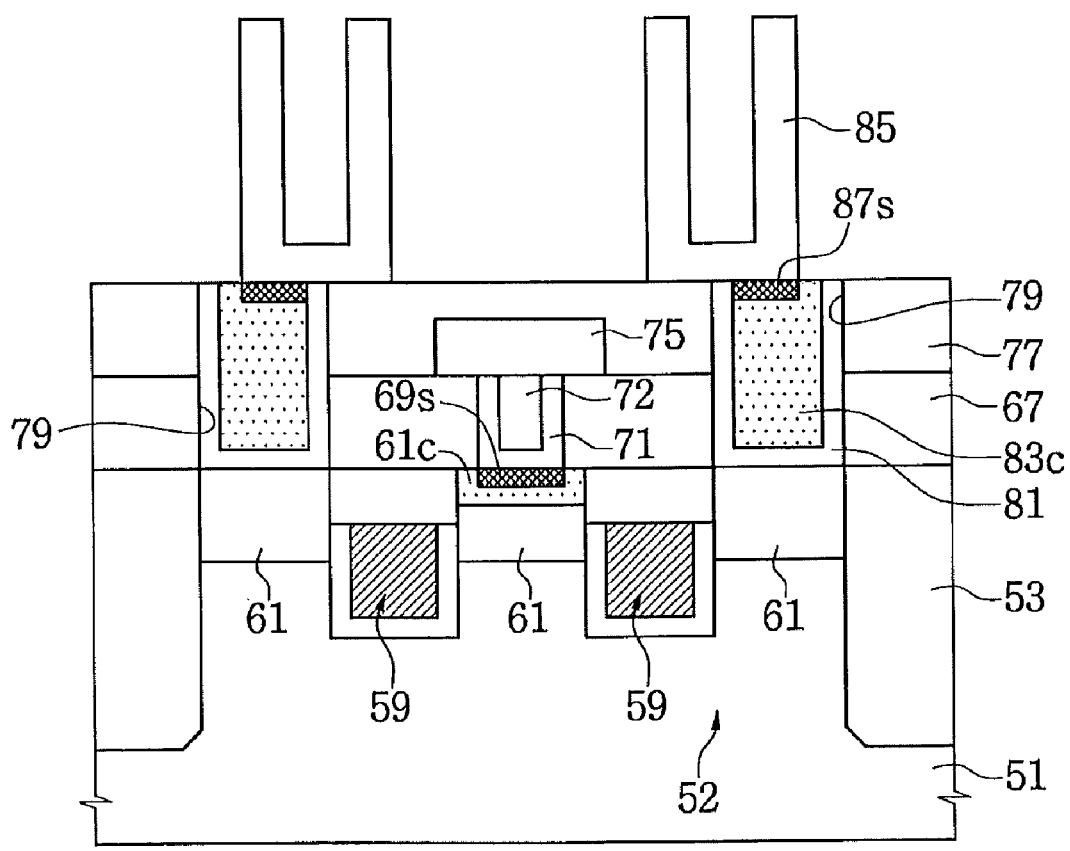

Referring to FIG. 16, a lower capacitor electrode 85 overlapping the third silicon layer 83C may be formed on the upper insulating layer 77. The lower capacitor electrode 85 may be a part of an OCS. The lower capacitor electrode 85 may be formed of one selected from the group consisting of Ti, TiN, Ta, TaN, W, WN, Co, Cu, Ni, Mo, and a combination thereof. A second metal silicide layer 87S may be formed by annealing the lower capacitor electrode 85 and the third silicon layer 83C. The second metal silicide layer 87S may include TiSiC, TiSiCN, TaSiC, TaSiCN, WSiC, WSiCN, CoSiC, CuSiC, NiSiC, and MoSiC. In some embodiments, the lower capacitor electrode 85 may be formed of a Ti/TiN layer. In this case, the second metal silicide layer 87S may be a TiSiC layer.

The second metal silicide layer 87S may be interposed between the lower capacitor electrode 85 and the third silicon layer 83C. The second metal silicide layer 87S may be in contact with the lower capacitor electrode 85, the second silicon layer 81, and the third silicon layer 83C. The lower capacitor electrode 85 may be in electrical contact with one of the source and drain regions 61 via the second metal silicide layer 87S, the third silicon layer 83C, and the second silicon layer 81.

[Sixth Example Embodiment]

Figure 17:
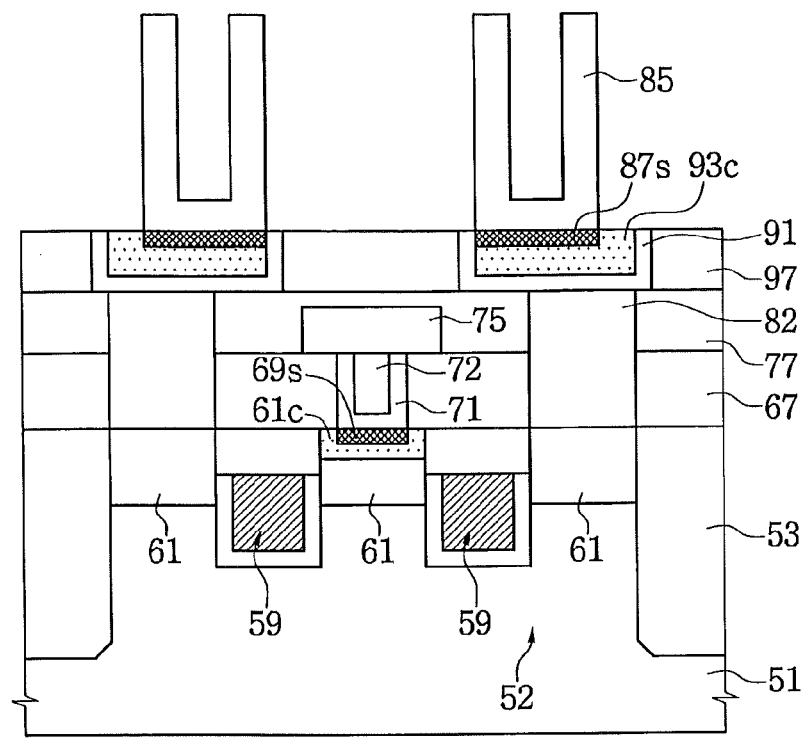
FIGS. 17 through 19 are cross-sectional views of semiconductor devices and methods of fabricating the same according to sixth through eighth example embodiments, respectively.

FIG. 17 is a cross-sectional view of a semiconductor device and a method of fabricating the same according to a sixth example embodiment.

Referring to FIG. 17, the semiconductor device according to the sixth example embodiment may include an isolation layer 53, gate patterns 59, and source and drain regions 61 on a substrate 51. An active region 52 may be defined on the substrate 51 by the isolation layer 53. A lower insulating layer 67 covering the gate patterns 59 and the source and drain regions 61 may be formed. A first silicon pattern 61C may be formed by injecting carbon into one of the source and drain regions 61. The first silicon pattern 61C may be formed to contain carbon at 1.0E20 to 5,0E20 atoms/cm³.

Bit plugs 71 and 72 passing through the lower insulating layer 67 may be formed. The bit plugs 71 and 72 may be formed of a barrier layer 71 and a first metal layer 72. A first metal silicide layer 69S may be formed between the barrier layer 71 and the first silicon pattern 61C. A bit line 75 in contact with the bit plugs 71 and 72 may be formed on the lower insulating layer 67. The bit line 75 may be in electrical contact with one of the source and drain regions 61 via the first metal layer 72, the barrier layer 71, the first metal silicide layer 69S, and the first silicon pattern 61C.

An interlayer insulating layer 77 covering the bit line 75 may be formed on the lower insulating layer 67. A buried contact plug 82 passing through the interlayer insulating layer 77 and the lower insulating layer 67 may be formed. An upper insulating layer 97 may be formed on the interlayer insulating layer 77. Landing pads 91 and 93C in contact with the buried contact plug 82 through the upper insulating layer 97 may be formed.

The landing pads 91 and 93C may be formed by sequentially stacking a second silicon pattern 91 and a third silicon pattern 93C. The landing pads 91 and 93C may be formed using one selected from the group consisting of CMP, etchback, and a combination thereof. The second silicon pattern 91 may be formed of a polysilicon layer. The third silicon pattern 93C may be formed of a polysilicon layer including carbon at a concentration of about 1.0E20 to about 5.0E20 atoms/cm³. Here, the second silicon pattern 91 may be a polysilicon layer including other impurity ions excluding carbon. For example, the second silicon pattern 91 may be a polysilicon layer including phosphorous. The second silicon pattern 91 may cover a sidewall and a bottom of the third silicon pattern 93C. The second silicon pattern 91 may be in contact with the buried contact plug 82.

A lower capacitor electrode 85 overlapping the third silicon pattern 93C may be formed on the upper insulating layer 97. The lower capacitor electrode 85 may be a part of an OCS. The lower capacitor electrode 85 may be formed of one selected from the group consisting of Ti, TiN, Ta, TaN, W, WN, Co, Cu, Ni, Mo, and a combination thereof. A second metal silicide layer 87S may be formed by annealing the lower capacitor electrode 85 and the third silicon pattern 93C. The second metal silicide layer 87S may include one selected from the group consisting of TiSiC, TiSiCN, TaSiC, TaSiCN, WSiC, WSiCN, CoSiC, CuSiC, NiSiC, and MoSiC. In some embodiments, the lower capacitor electrode 85 may be formed of a Ti/TiN layer. In this case, the second metal silicide layer 87S may be a TiSiC layer.

The second metal silicide layer 87S may be interposed between the lower capacitor electrode 85 and the third silicon pattern 93C. The second metal silicide layer 87S may be in contact with the lower capacitor electrode 85, the second silicon pattern 91, and the third silicon pattern 93C. The lower capacitor electrode 85 may be in electrical contact with one of the source and drain regions 61 via the second metal silicide layer 87S, the third silicon pattern 93C, the second silicon pattern 91, and the buried contact plug 82.

[Seventh Example Embodiment]

Figure 18:
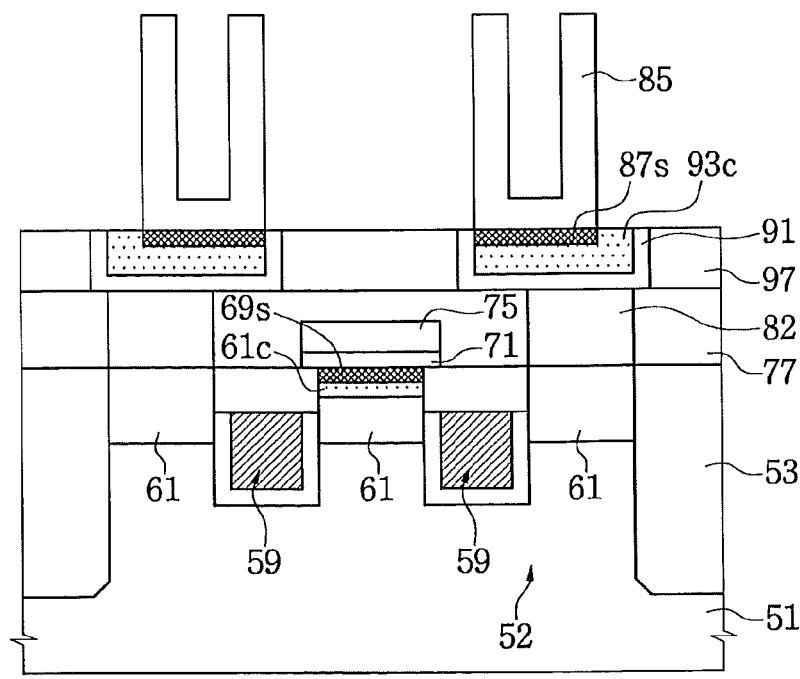

FIG. 18 is a cross-sectional view of a semiconductor device and a method of fabricating the same according to a seventh example embodiment.

Referring to FIG. 18, the semiconductor device according to the seventh example embodiment may include an isolation layer 53, gate patterns 59, and source and drain regions 61 on a substrate 51. An active region 52 may be defined on the substrate 51 by the isolation layer 53. A first silicon pattern 61C may be formed by injecting carbon into one of the source and drain regions 61. The first silicon pattern 61C may be formed to contain carbon at 1.0E20 to 5.0E20 atoms/cm³.

Bit lines 71 and 75 may be formed on the first silicon pattern 61C. The bit lines 71 and 75 may be formed by sequentially stacking a barrier layer 71 and a bit conductive layer 75. The barrier layer 71 may be formed of a metal layer such as one selected from the group consisting of Ti, TiN, Ta, TaN, and a combination thereof. For example, the barrier layer 71 may be formed of a Ti layer, or a Ti/TiN layer. The bit conductive layer 75 may be formed of a conductive layer such as one selected from the group consisting of Ti, TiN, Ta, TaN, W, WN, Co, Cu, Ni, Mo, and a combination thereof.

A first metal silicide layer 69S may be formed between the barrier layer 71 and the first silicon pattern 61C. The bit lines 71 and 75 may be in electrical contact with one of the source and drain regions 61 via the first metal silicide layer 69S and the first silicon pattern 61C.

An interlayer insulating layer 77 covering the bit lines 71 and 75 may be formed on the substrate 51. A buried contact plug 82 passing through the interlayer insulating layer 77 may be formed. An upper insulating layer 97 may be formed on the interlayer insulating layer 77. Landing pads 91 and 93C in contact with the buried contact plug 82 through the upper insulating layer 97 may be formed.

The landing pads 91 and 93C may be formed by sequentially stacking a second silicon pattern 91 and a third silicon pattern 93C. The landing pads 91 and 93C may be formed using one selected from the group consisting of CMP, etchback, and a combination thereof The second silicon pattern 91 may be formed of a polysilicon layer. The third silicon pattern 93C may be formed of a polysilicon layer including carbon at a concentration of about 1.0E20 to about 5.0E20 atoms/cm³. Here, the second silicon pattern 91 may be a polysilicon layer including other impurity ions excluding carbon. For example, the second silicon pattern 91 may be a polysilicon layer including phosphorous. The second silicon pattern 91 may cover a sidewall and a bottom of the third silicon pattern 93C. The second silicon pattern 91 may be in contact with the buried contact plug 82.

A lower capacitor electrode 85 overlapping the third silicon pattern 93C may be formed on the upper insulating layer 97. The lower capacitor electrode 85 may be a part of an OCS. The lower capacitor electrode 85 may be formed of one selected from the group consisting of Ti, TiN, Ta, TaN, W, WN, Co, Cu, Ni, Mo, and a combination thereof. A second metal silicide layer 87S may be formed by annealing the lower capacitor electrode 85 and the third silicon pattern 93C. The second metal silicide layer 87S may include one selected from the group consisting of TiSiC, TiSiCN, TaSiC, TaSiCN, WSiC, WSiCN, CoSiC, CuSiC, NiSiC, and MoSiC. In some embodiments, the lower capacitor electrode 85 may be formed of a Ti/TiN layer. In this case, the second metal silicide layer 87S may be a TiSiC layer.

The second metal silicide layer 87S may be interposed between the lower capacitor electrode 85 and the third silicon pattern 93C. The second metal silicide layer 87S may be in contact with the lower capacitor electrode 85, the second silicon pattern 91, and the third silicon pattern 93C. The lower capacitor electrode 85 may be in electrical contact with one of the source and drain regions 61 via the third silicon pattern 93C, the second silicon pattern 91, and the buried contact plug 82.

[Eighth Example Embodiment]

Figure 19:
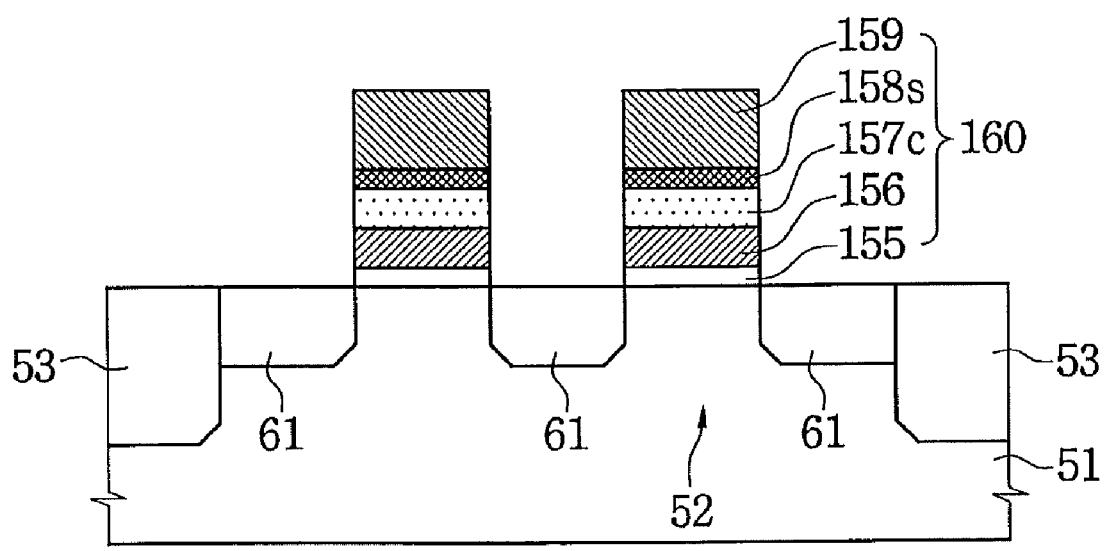

FIG. 19 is a cross-sectional view of a semiconductor device and a method of fabricating the same according to an eighth example embodiment.

Referring to FIG. 19, the semiconductor device according to the eighth example embodiment may include an isolation layer 53, gate patterns 59, and source and drain regions 61 on a substrate 51. An active region 52 may be defined on the substrate 51 by the isolation layer 53. Each gate pattern 160 may include a gate dielectric layer 155, a first silicon pattern 156, a second silicon pattern 157C, a metal silicide layer 158S, and a metal gate electrode 159. The metal silicide layer 158S may be in contact with the metal gate electrode 159 and the second silicon pattern 157C. In some embodiments, the second silicon pattern 157C can be referred to as a polysilicon gate, and the metal gate electrode 159 may be referred to as a metal gate.

To be specific, the first silicon pattern 156 may be formed by depositing a polysilicon layer on the gate dielectric layer 155. The second silicon pattern 157C may be formed by depositing a polysilicon layer including carbon at concentration of about 1.0E20 to about 5.0E20 atoms/cm$^3$ on the first silicon pattern 156. Here, the first silicon pattern 156 may be a polysilicon layer including other impurity ions excluding carbon. The metal gate electrode 159 may be formed on the second silicon pattern 157C. The metal gate electrode 159 may be formed of one selected from the group consisting of Ti, TiN, Ta, TaN, W, WN, Co, Cu, Ni, Mo, and a combination thereof. For example, the metal gate electrode 159 may be formed of a W layer, and/or a WN layer. The metal silicide layer 158S may be formed by annealing the metal gate electrode 159 and the second silicon pattern 157C. The metal silicide layer 158S may include one selected from the group consisting of TiSiC, TiSiCN, TaSiC, TaSiCN, WSiC, WSiCN, CoSiC, CuSiC, NiSiC, and MoSiC.

According to example embodiments, a grain of polysilicon including carbon is small, and thus characteristics of a silicide layer formed by substantial annealing can be improved.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising: an impurity region; a silicon layer, on top of the impurity region, including an outer portion without including carbon; an inner portion of the silicon layer including carbon, inside the outer portion; a metal layer formed on the inner portion of the silicon layer to expose the outer portion; and a silicide layer between the inner portion of the silicon layer including the carbon and the metal layer and separated from the impurity region.

2. The device according to claim 1, wherein the metal layer includes a barrier layer.

3. The device according to claim 2, wherein the barrier layer comprises titanium.

4. The device according to claim 3, wherein the metal layer further includes another conductive layer formed on the barrier layer.

5. A semiconductor device, comprising: an impurity region; a first contact pad, formed on an uppermost surface of the impurity region, without including carbon; a second contact pad including carbon inside the first contact pad and separated from the impurity region by the first contact pad; a silicide layer contacting the second contact pad; and a metal layer formed on contacting the silicide layer.

6. The device according to claim 5, wherein the metal layer comprises a lower electrode of a capacitor.

7. The device according to claim 5, wherein the metal layer comprises a contact plug.

8. A semiconductor device, comprising: a first silicon pattern including carbon on top of a source/drain region in a substrate; a second silicon pattern substantially free of carbon, surrounding and in contact with the first silicon pattern on the source/drain region a metal pattern formed on the first silicon pattern; and a metal silicide layer comprising a silicide of the silicon and carbon included in the first silicon pattern and the metal in the metal pattern, the metal silicide lager in contact with upper surfaces of the first and second silicon patterns.

9. The device according to claim 8, wherein the second silicon pattern covers a sidewall and a bottom of the first silicon pattern.

10. The device according to claim 8, wherein the first silicon pattern includes a polysilicon layer, and the second silicon pattern includes a polysilicon layer.

11. The device according to claim 8, further comprising:
an interlayer insulating layer formed on the substrate, wherein the first and second silicon patterns are formed in a contact hole passing through the interlayer insulating layer.

12. The device according to claim 8, wherein the metal pattern include one selected from the group consisting of Ti, TiN, Ta, TaN, W, WN, Co, Cu, Ni, and Mo.

13. The device according to claim 8, wherein the metal silicide layer includes one selected from the group consisting of TiSiC, TiSiCN, TaSiC, TaSiCN, WSiC, WSiCN, CoSiC, CuSiC, NiSiC, and MoSiC.

14. The device according to claim 8, wherein the first silicon pattern includes the carbon at a concentration of about 1.0E20 to about 5.0E20 atoms/cm$^3$.

15. The device according to claim 1, wherein the outer portion of the silicon layer is interposed between the impurity region and the inner portion of the silicon layer.

16. The device according to claim 15, wherein the outer portion is disposed on a sidewall of the inner portion.

* * * * *